United States Patent [19]
Aritome

[11] Patent Number: 6,023,423
[45] Date of Patent: Feb. 8, 2000

[54] NONVOLATILE SEMICONDUCTOR MEMORY DEVICE

[75] Inventor: Seiichi Aritome, Yokohama, Japan

[73] Assignee: Kabushiki Kaisha Toshiba, Kawasaki, Japan

[21] Appl. No.: 08/997,722

[22] Filed: Dec. 23, 1997

[30]     Foreign Application Priority Data

Dec. 25, 1996  [JP]  Japan .................................. 8-345195

[51] Int. Cl.⁷ .................................................. G11C 16/04
[52] U.S. Cl. .............................. 365/185.11; 365/185.29; 365/185.17
[58] Field of Search ........................ 371/21.1; 395/430, 395/481; 365/201, 185.29, 185.3, 185.33, 185.12, 185.17, 185.11

[56]           References Cited

U.S. PATENT DOCUMENTS

| | | | |
|---|---|---|---|
| 5,293,337 | 3/1994 | Aritome et al. ......................... | 365/185 |
| 5,361,227 | 11/1994 | Tanaka et al. ...................... | 365/189.01 |
| 5,436,913 | 7/1995 | Yamamura et al. .................... | 371/21.2 |
| 5,596,738 | 1/1997 | Pope ........................................ | 395/430 |
| 5,602,789 | 2/1997 | Endoh et al. ........................... | 365/201 |
| 5,611,067 | 3/1997 | Okamoto et al. ....................... | 395/430 |
| 5,680,347 | 10/1997 | Takeuchi et al. .................. | 365/185.17 |

*Primary Examiner*—David Nelms
*Assistant Examiner*—Thong Le
*Attorney, Agent, or Firm*—Banner & Witcoff, Ltd.

[57]           ABSTRACT

A nonvolatile semiconductor memory device includes a memory cell array having a plurality of pages, each page being formed of a plurality of memory cells connected to one word line, and serving as the data write unit, and a plurality of blocks formed of a plurality of pages, and a controller for selecting any one of the plurality of blocks, selecting any one of pages in the selected block, erasing data stored in the selected page, and then writing new data in the selected page, while reading data stored in non-selected pages within the selected block, storing the data in a buffer memory outside the memory cell, a dedicated buffer memory in the memory cell, or an unused block in the memory cell, performing a data erase, and rewriting the data stored in the buffer memory or unused block.

23 Claims, 10 Drawing Sheets

NONVOLATILE SEMICONDUCTOR MEMORY DEVICE

BACKGROUND OF THE INVENTION

The present invention relates to a nonvolatile semiconductor memory device, a method of controlling the same, and a memory card or memory system using the same and, more particularly, to a nonvolatile semiconductor memory device in which memory cells each having a MOS transistor structure are connected to form a memory cell unit, a method of controlling the same, and a memory card or memory system using the same.

This application is based on Japanese Patent Application No. 08-345195, filed Dec. 25, 1996, the content of which is incorporated herein by reference.

Recently, as an electrically erasable nonvolatile semiconductor memory device, an EEPROM having a structure in which one unit is formed of memory cells and connected to a data line is known. In this structure, the number of contacts with data lines can be decreased in order to increase the integration degree. An example of the EEPROM has an arrangement in which memory cells are series-connected to form one unit cell (to be referred to as a NAND-type cell hereinafter). FIG. 1 is a plan view showing one NAND-type cell in an EEPROM of this type. FIGS. 2 and 3 are sectional views taken along the lines II—II and III—III in FIG. 1, respectively. The same reference numerals denote the same constituent elements, and a description thereof will be omitted.

As shown in FIGS. 1, 2, and 3, in the NAND-type cell, e.g., a p-type well 12 is formed on an n-type silicon substrate 14, and an element isolation insulating film 32 is selectively formed on the p-type well 12.

A NAND-type cell formed of memory cells (e.g., four memory cells) M11 to M14 and two selection transistors QS1 and QS2 which are series-connected to each other is formed in a region surrounded by the element isolation insulating film 32.

In a memory cell forming a NAND-type cell, a first gate insulating film 30 is formed on the p-type well 12 surrounded by the element isolation insulating film 32.

A floating gate 16 (16-1 to 16-4) made of, e.g., a polysilicon film is formed on the first gate insulating film 30. A second gate insulating film 34 is formed on the floating gate 16, and a control gate 18 (18-1 to 18-4) made of, e.g., a polysilicon film is formed on the second gate insulating film 34.

In the selection transistors QS1 and QS2, a gate insulating film is formed on the p-type well 12, and gate electrodes 20 and 22 made of polysilicon are formed on the gate insulating film. First layers 20a and 22a of the gate electrodes 20 and 22 are formed at the same time as the floating gate 16, and second layers 20b and 22b are formed at the same time as the control gate 18. In the gate electrodes 20 and 22, the first layers 20a and 22a and the second layers 20b and 22b are electrically connected at desired portions (not shown).

The control gates 18-1 to 18-4 of the memory cell are successively formed in the row direction, and connected to the control gates of the memory cells of an adjacent NAND-type cell to form word lines WL1 to WL4. The potentials of the word lines WL1 to WL4 are represented by Vcg1 to Vcg4. The gate electrodes 20 and 22 of the selection transistors QS1 and QS2 are also successively formed in the row direction, and serve as selection gate lines SG1 and SG2. The potentials of the selection gate lines SG1 and SG2 are represented by Vsg1 and Vsg2.

N-type diffusion layers 40, 42, 44, 46, 48, 50, and 52 serving as source and drain regions are formed on the p-type well 12. These source and drain regions are commonly used by adjacent memory cells, and adjacent memory cells and selection transistors. As a result, the current paths of the selection transistor QS1, the memory cells M11 to M14, and the selection transistor QS2 are series-connected to form a NAND-type cell. The drain region 40 of the selection transistor QS1 is connected to a bit line (BL1) 24 via an $n^+$-type diffusion layer 54 and a contact opening 26. The source region 52 of the selection transistor QS2 is connected to a source line.

FIG. 4 shows a so-called NAND-type EEPROM formed of integrating above-described NAND-type cells in an array.

A set of memory cells connected to the same word line is generally called one page. A set of pages between a selection transistor group on the drain side connected to a single selection gate line and a selection transistor group on the source side connected to a single selection gate line is called one NAND block or simply one block. One block is normally the minimum independent erasable unit.

For example, in FIG. 4, one page is formed of memory cells M11, M21, . . . , Mn1 connected to the word line WL1. One block is formed of the memory cells M11, M12, . . . , Mn3, and Mn4 sandwiched between selection transistors QS1, QS3, . . . , QS2n−1 on the drain side and selection transistors QS2, QS4, . . . , QS2n on the source side. The drains of the selection transistors QS1, QS3, . . . , QS2n−1 are respectively connected to bit lines BL1, BL2, . . . , BLn, whereas the sources of the selection transistors QS2, QS4, . . . , QS2n receive a source potential Vs.

The operation of the NAND-type EEPROM shown in FIG. 4 will be described below.

FIG. 5 shows the voltage of the NAND-type cell, and FIG. 6 is a timing chart showing the operation of the NAND-type cell. An operation performed when data is written in a block formed of the memory cells M11 to Mn4 will be explained.

Before writing data in a memory cell, data already written in the memory cells are erased. Data is erased in units of NAND blocks. At this time, the contents of memory cells in the same NAND block are simultaneously erased. In a selected NAND block, the potentials Vcg1 to Vcg4 of all the word lines WL1 to WL4 are set to a reference potential VSS (e.g., 0V), and the high voltage VPP (e.g., 18V) is applied to a potential Vwell of the p-type well and a potential Vsub of the n-type substrate. Potentials Vbit1, Vbit2, . . . of the bit lines BL1, BL2, . . . and potentials Vsg1 and Vsg2 of the selection gate lines SG1 and SG2 are set to the high voltage VPP, e.g., 18V. As a result, electrons are discharged from the floating gates to the substrate in all the memory cells to shift the threshold to the negative direction. This state is normally defined as a state "1". When data of the whole chip is to be erased, all NAND blocks are set in a selected state.

A data write operation will be described below.

Data is written in units of pages in the order from a memory cell most distant from the bit line. The high voltage VPP (e.g., 20V) is applied to a word line corresponding to a page subjected to a data-write operation in the NAND block, while an intermediate potential VM (e.g., 10V) is applied to the remaining non-selected word lines. Vsg1 is set to VM (10V), and Vsg2 is to VSS (0V). VSS or VM is applied to the bit lines BL1, BL2, . . . , BLn in accordance with write data. Upon applying VSS to the bit line (write "0"), the potential is transferred to a selected memory cell to inject electrons to its floating gate. As a result, the threshold of the selected memory cell shifts to the positive direction. Normally, this state is defined as a state "0". When VM is applied to the bit line (write "1"), the threshold does not change and remains negative because no electron is injected to the memory cell. This write operation is repeatedly performed in the order from the memory cells M14 to Mn4, M13 to Mn3, M12 to Mn2, and M11 to Mn1 of the respective pages.

A data read operation will be explained below. Data is read in units of cells. The potential of the control gate of a selected memory cell in a NAND block, e.g., the potential Vcg4 of the control gate of the memory cell M14 in FIG. 6 is set to VSS, and the potentials of the remaining control gates and the gate potentials of the selection transistors are set to VCC (e.g., 5V). At this time, whether a current flows in the selected memory cell M14 is checked to determine data.

An erroneous write mode generated in a data write will be described. The erroneous write mode is generated because the intermediate potential VM is applied to a non-selected word line in a write operation. Since VSS or VM is applied to the bit line in accordance with data, if the drain voltage is 0V (VSS) when the gate voltage of a non-selected memory cell is VM (about 10V), the memory cell becomes in a weak electron injection mode (weak write) in which a small number of electrons are injected to the floating gate. For example, in a 16-bit NAND-type cell obtained by series-connecting 16 memory cells, this erroneous write mode occurs 15 times in one write cycle (write to all pages in one block) in the worst case. Normally, however, even if the erroneous write mode occurs 15 times, this does not cause any write error (in this specification, erroneous write mode means a weak electron injection mode (weak write) in which a small number of electrons are injected to the floating gate, and write error means that a large number of electrons are injected to the floating gate so as to change the value of data) because a block is erased before a next write to the block to clear the data written weak.

As described above, in the EEPROM (so-called block erase/page write EEPROM) in which data is erased in units of blocks, no erroneous write mode poses any problem because only the influence of the erroneous write mode corresponding to the number of pages of one block at most is accumulated.

In recent years, however, the use of an EEPROM (so-called page erase/page write EEPROM) using not a block but a smaller page as the erase unit is examined. When data is erased in units of pages, the erroneous write mode poses a problem.

For example, the case wherein data is to be erased from a page connected to the word line WL2 and then data is to be written therein will be explained. Vcg2 is set to 0V, and a high voltage of 18V is applied to Vcg1, Vcg3, Vcg4, Vwell, and Vsub to perform a page erase. At this time, only cells connected to the word line WL2, electric charges in the floating gates are discharged to the substrate. No discharge occurs in cells connected to the word lines WL1, WL3, and WL4. Then, data are written in the cells of the selected page. That is, a page write operation is performed. Vcg2 is set to 20V, Vcg1, Vcg3, and Vcg4 are to 10V, and write data are supplied to the bit lines BL1 to BLn to perform a write operation. At this time, cells connected to Vcg1, Vcg3, and Vcg4 become in the erroneous write mode.

In this manner, when data of only one page in a block is erased, and data is written in this page, the remaining memory cells in the same block are in the erroneous write mode during one cycle of the write time. For this reason, e.g., when a page erase/page write operation for the same page is repeatedly performed $10^6$ times, the remaining memory cells are in the erroneous write mode for a time $10^6$ times the write time. As for each of other pages in the same block, if a page erase/page write operation is performed $10^6$ times, when one block is formed of, e.g., 16 pages, the erroneous write mode state occurs $10^6 \times 15$ times in the worst case. In this case, a write error occurs, resulting in a failure.

BRIEF SUMMARY OF THE INVENTION

Accordingly, it is an object of the present invention to provide a nonvolatile semiconductor memory device in which, even if a page erase/page write operation is performed, no failure due to the erroneous write mode occurs, and high reliability can be secured, a method of controlling the same, and a memory card or memory system using the same.

According to the present invention, there is provided a nonvolatile semiconductor memory device comprising:

a memory cell array having parts each formed of memory cells and serving as a data write unit, and blocks each formed of the parts, wherein any one of the blocks is selected, any one of parts in a selected block is selected, data stored in a selected part is erased, new data is written in the selected part, data stored in non-selected parts within the selected block is reading and stored, data of the non-selected parts are erased, and stored data are rewritten in the non-selected parts.

According to the present invention, there is provided a memory card comprising:

a nonvolatile semiconductor memory device having parts each formed of memory cells and serving as a data write unit, and blocks each formed of parts; and a controller for selecting any one of the blocks, selecting any one of parts in a selected block, erasing data stored in a selected part, writing new data in the selected part, reading data stored in non-selected parts within the selected block, storing a read data, performing erasing data of the non-selected parts, and rewriting a stored data in the non-selected parts.

According to the present invention, there is provided a memory system comprising:

a memory card having a nonvolatile semiconductor memory device with parts each formed of memory cells and serving as a data write unit, and blocks each formed of parts; and a controller for selecting any one of the blocks, selecting any one of the parts in a selected block, erasing data stored in the selected part, writing new data in the selected part, reading data stored in non-selected parts within the selected block, storing a read data, erasing data of the non-selected parts, and rewriting the data stored in the buffer memory in the non-selected parts.

According to the present invention, there is provided a method of controlling a nonvolatile semiconductor memory device, comprising:

a first step of selecting a block in a memory cell array including parts each formed of memory cells and serving as a data write unit, and blocks each formed of parts, and any one of the parts in a selected block;

a second step of erasing data stored in memory cells of a selected part, and writing new data in the memory cells of the selected part; and a third step of reading data stored in non-selected parts within the selected block, storing a read data, erasing data of the non-selected parts, and rewriting a stored data in the non-selected parts.

According to the present invention, when an erase/write operation is performed in units of parts, data of all parts other than a selected part in the same block are temporarily read and stored. After the data of these parts are erased, the stored data are rewritten. Therefore, no influence of the erroneous write mode is accumulated not to cause a write error.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and form a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a nonvolatile semiconductor memory device according to the present invention will now be described with reference to the accompanying drawings.
(First Embodiment)

Figure 1:
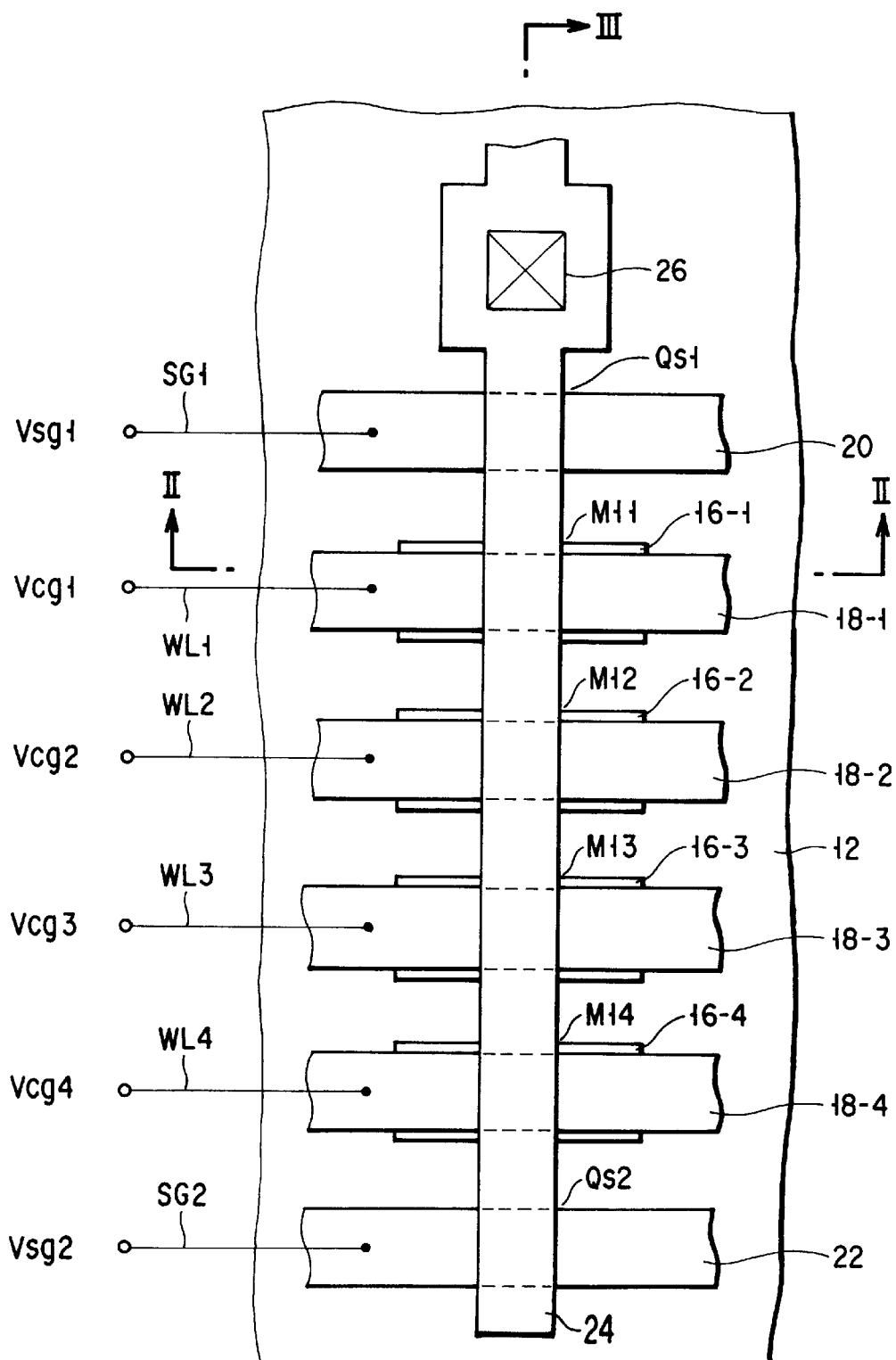
FIG. 1 is a plan view showing one NAND-type cell of a conventional EEPROM.
Figure 2:
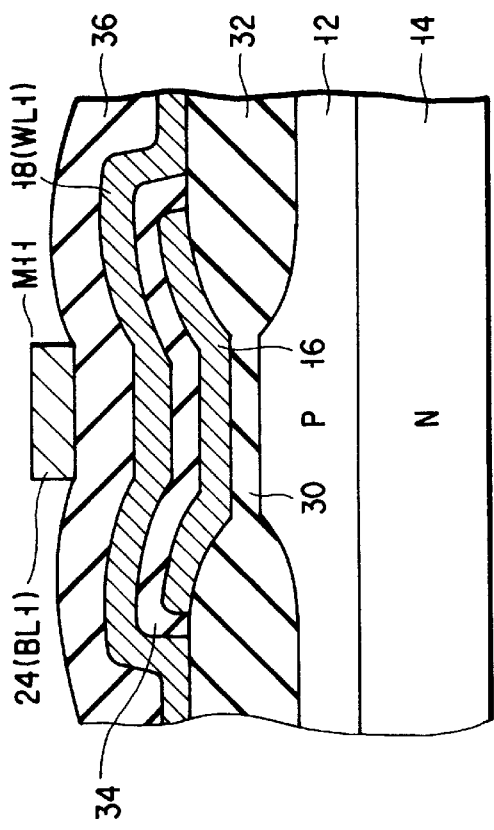
FIG. 2 is a sectional view taken along the line II—II in FIG. 1.
Figure 3:
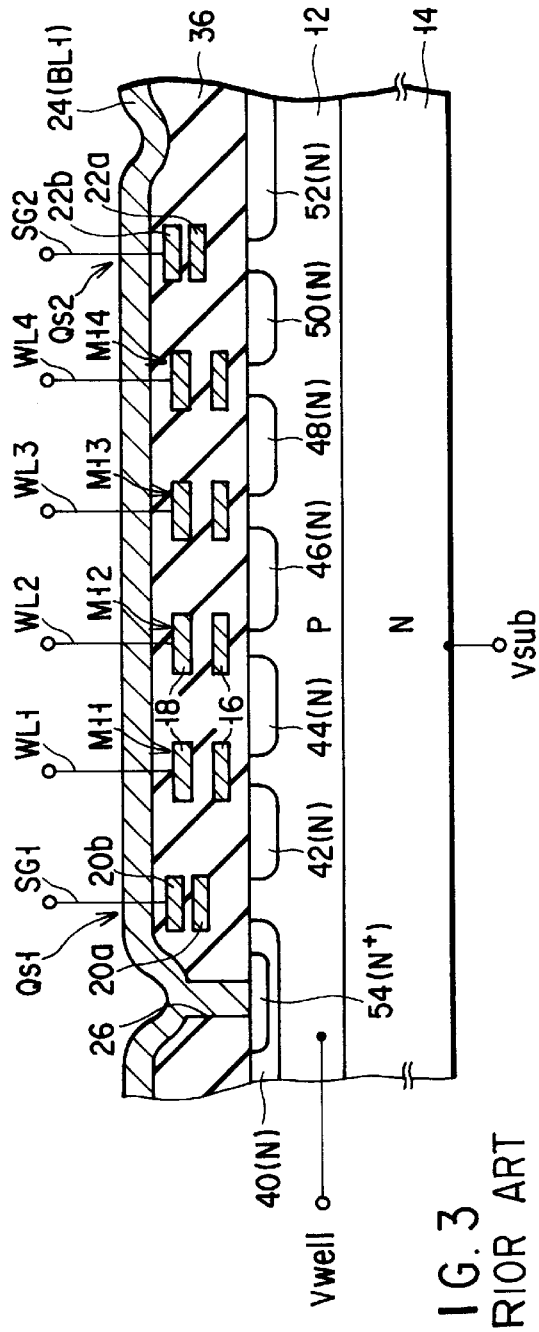
FIG. 3 is a sectional view taken along the line III—III in FIG. 1.
Figure 4:
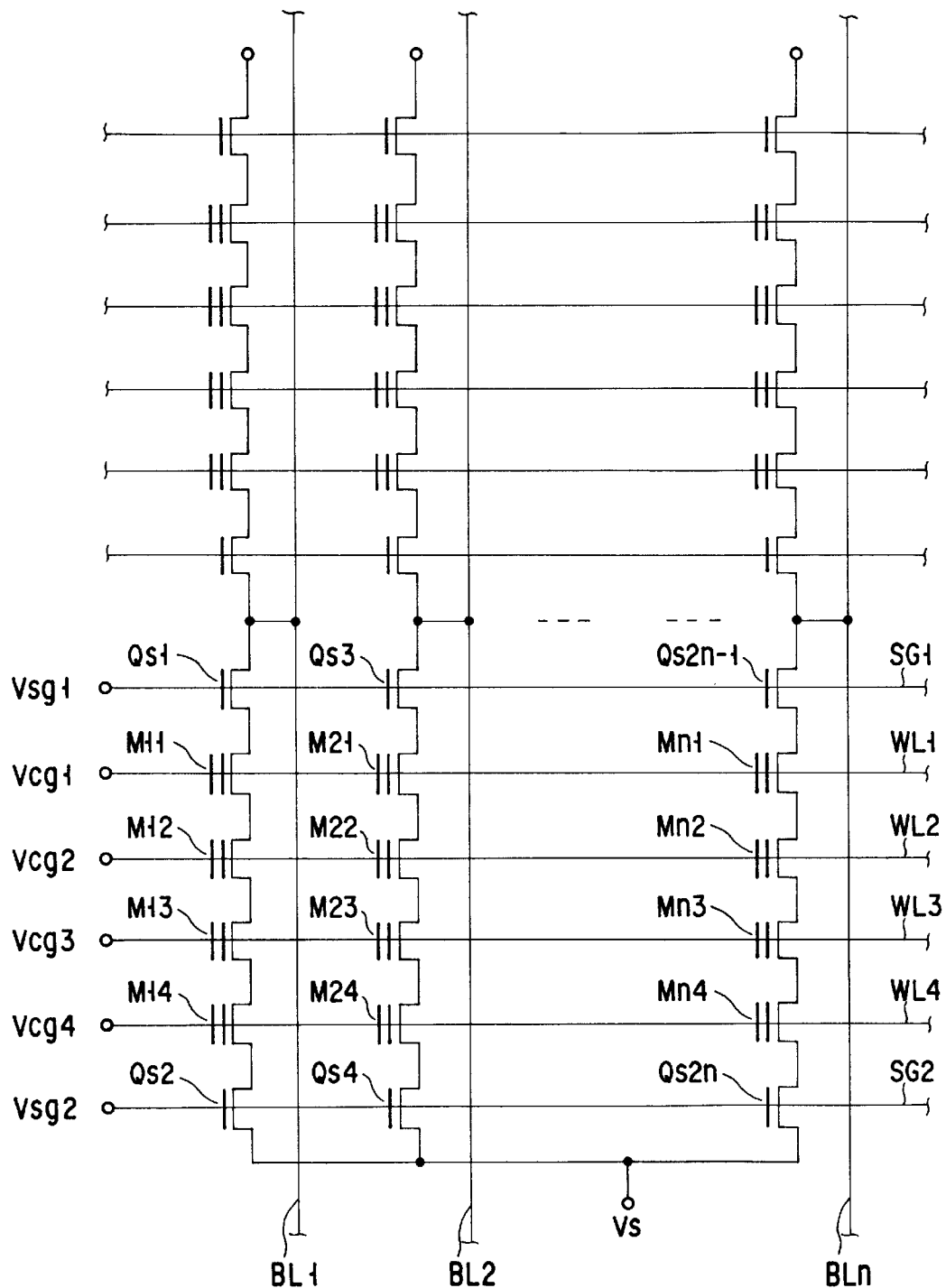
FIG. 4 is an equivalent circuit diagram of the NAND-type cell array in the EEPROM shown in FIG. 1.
Figure 7:
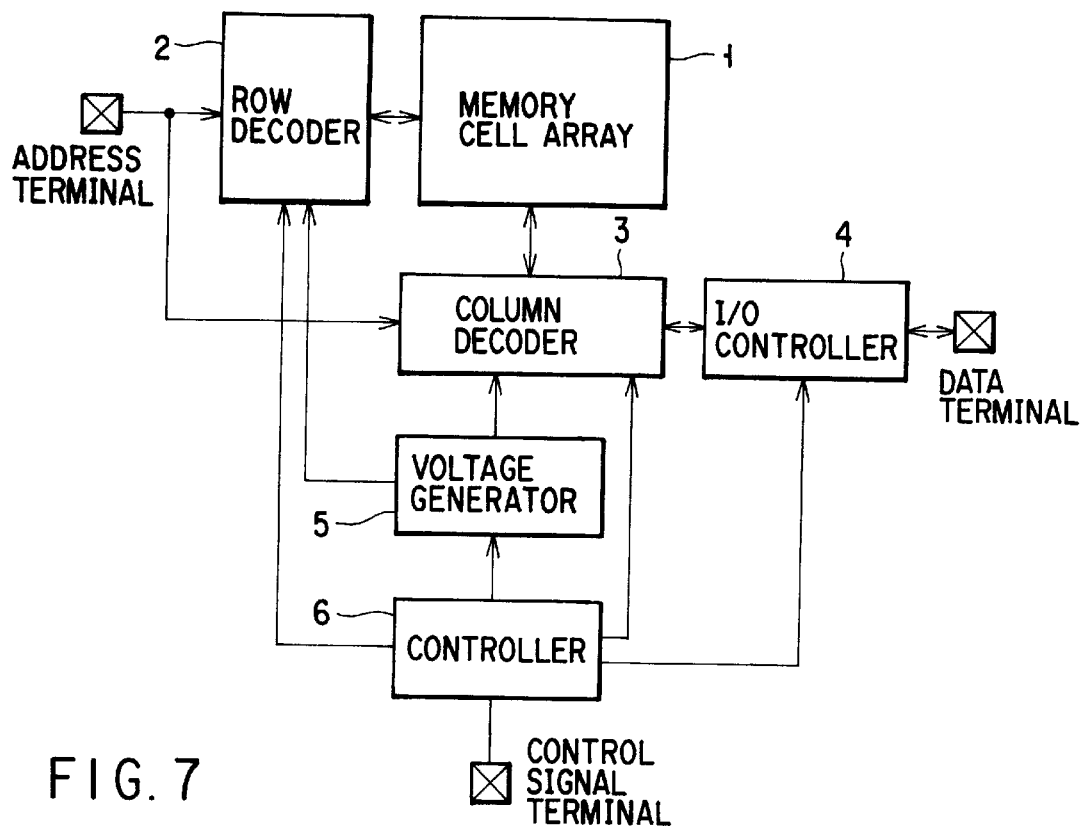
FIG. 7 is a block diagram showing a first embodiment of a nonvolatile semiconductor memory device according to the present invention.

FIG. 7 is a block diagram showing the arrangement of the first embodiment according to the present invention in which a page erase/page write operation can be performed. A memory cell array 1 is formed of at least one NAND-type cell block. Each NAND-type cell has, e.g., an arrangement shown in FIGS. 1, 2, and 3. Each NAND-type cell block has the same arrangement as that of the block of the NAND-type EEPROM shown in FIG. 4, and is formed of plural pages.

An address signal input from an address terminal is supplied to the input terminals of row decoder 2 and column decoder 3. The output terminal of the row decoder 2 is connected to the word line and the selection gate line of a selection transistor of the memory cell array 1. The output terminal of the column decoder 3 is connected to the bit line of the memory cell array 1.

A voltage generator 5 comprises, e.g., a booster and a selector, generates a high potential VPP of, e.g., 18V or 20V and an intermediate potential VM of, e.g., 10V, and selects a predetermined potential from these potentials and a power supply potential of, e.g., 5V to supply it to the power supply terminals of the row decoder 2 and column decoder 3.

A controller 6 controls the voltage generator 5, the row decoder 2, the column decoder 3, and an I/O controller 4.

The I/O controller 4 externally inputs/outputs data to be written in the memory cell array 1 or data read from the memory cell array 1 via the column decoder 3.

Figure 5:
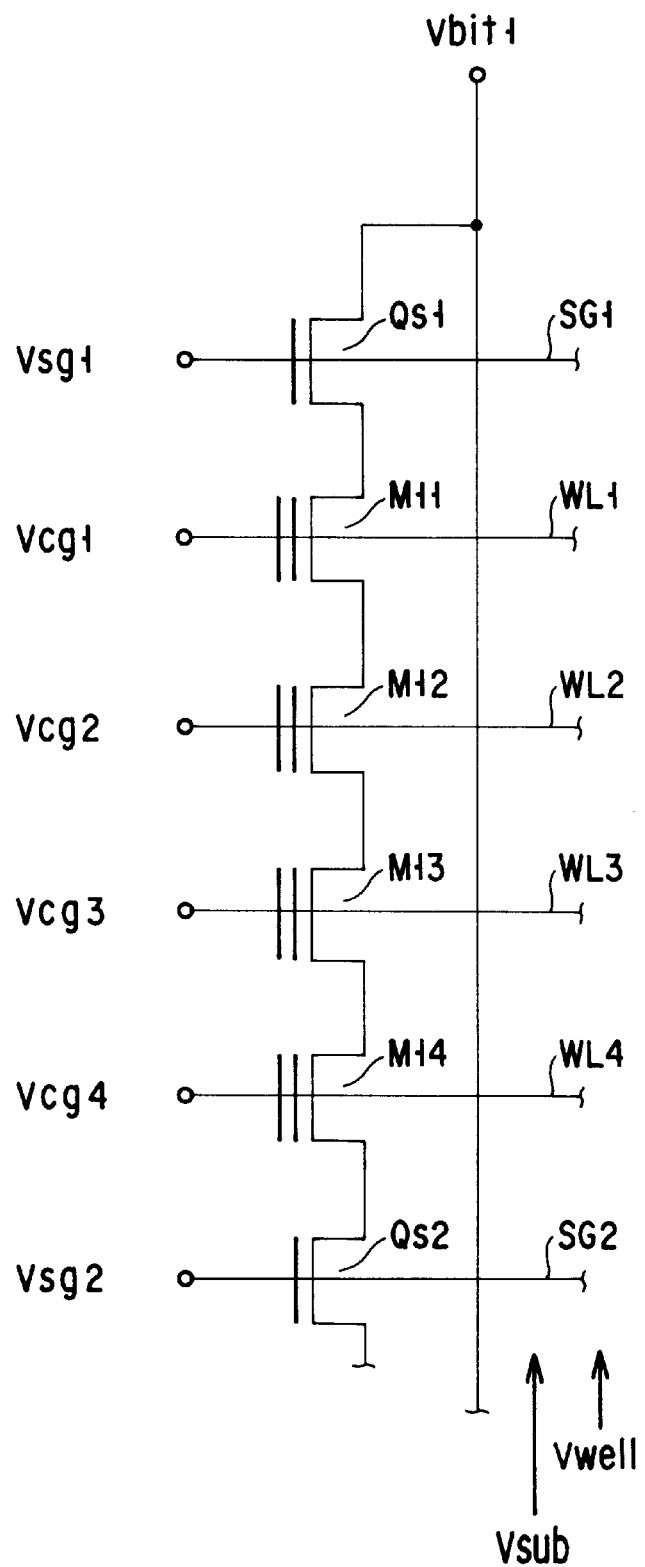
FIG. 5 is a circuit diagram showing respective voltages of the NAND-type cell shown in FIG. 4.
Figure 6:
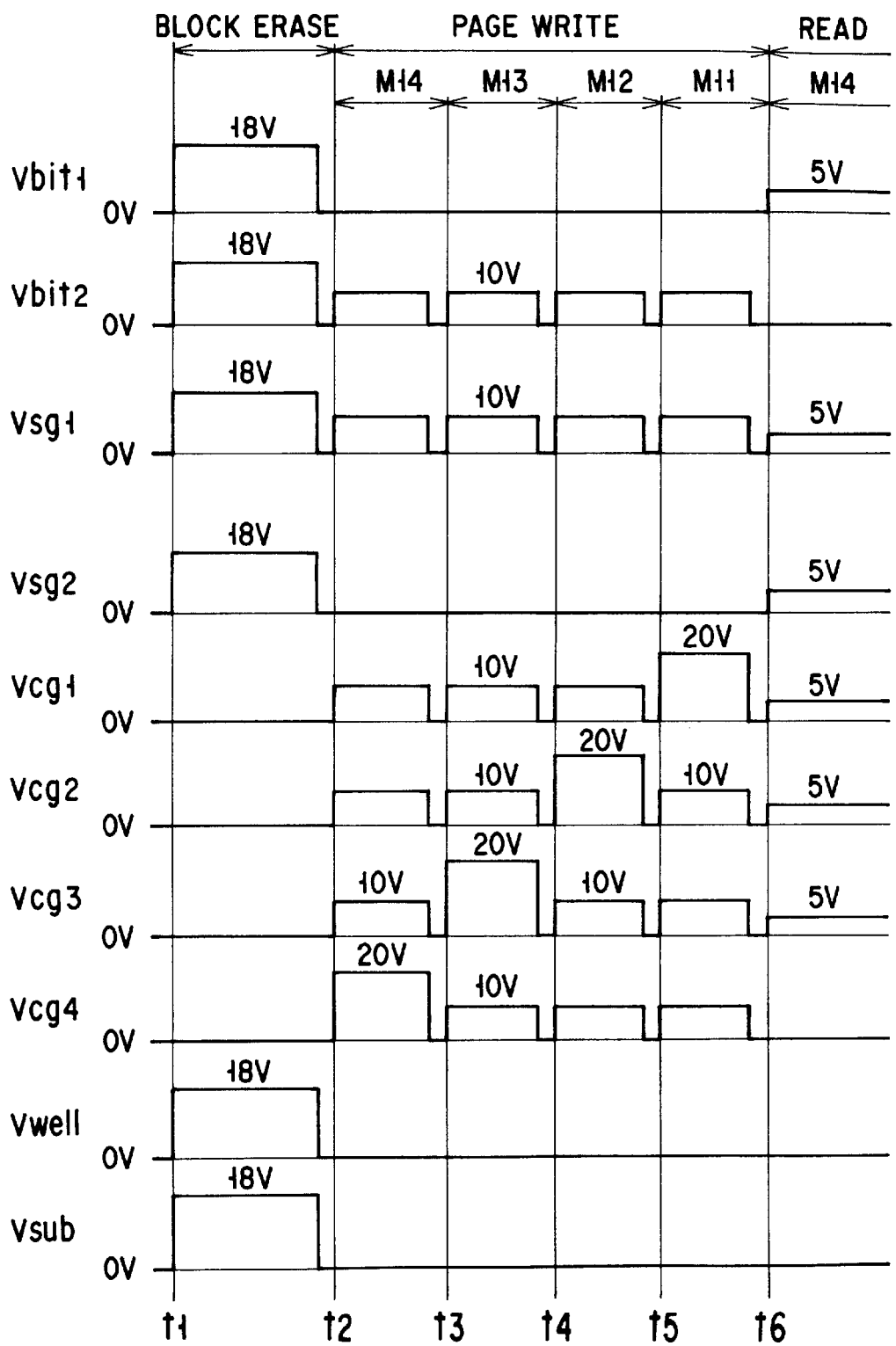
FIG. 6 is a timing chart showing the block erase operation of the NAND-type cell shown in FIG. 4.
Figure 8:
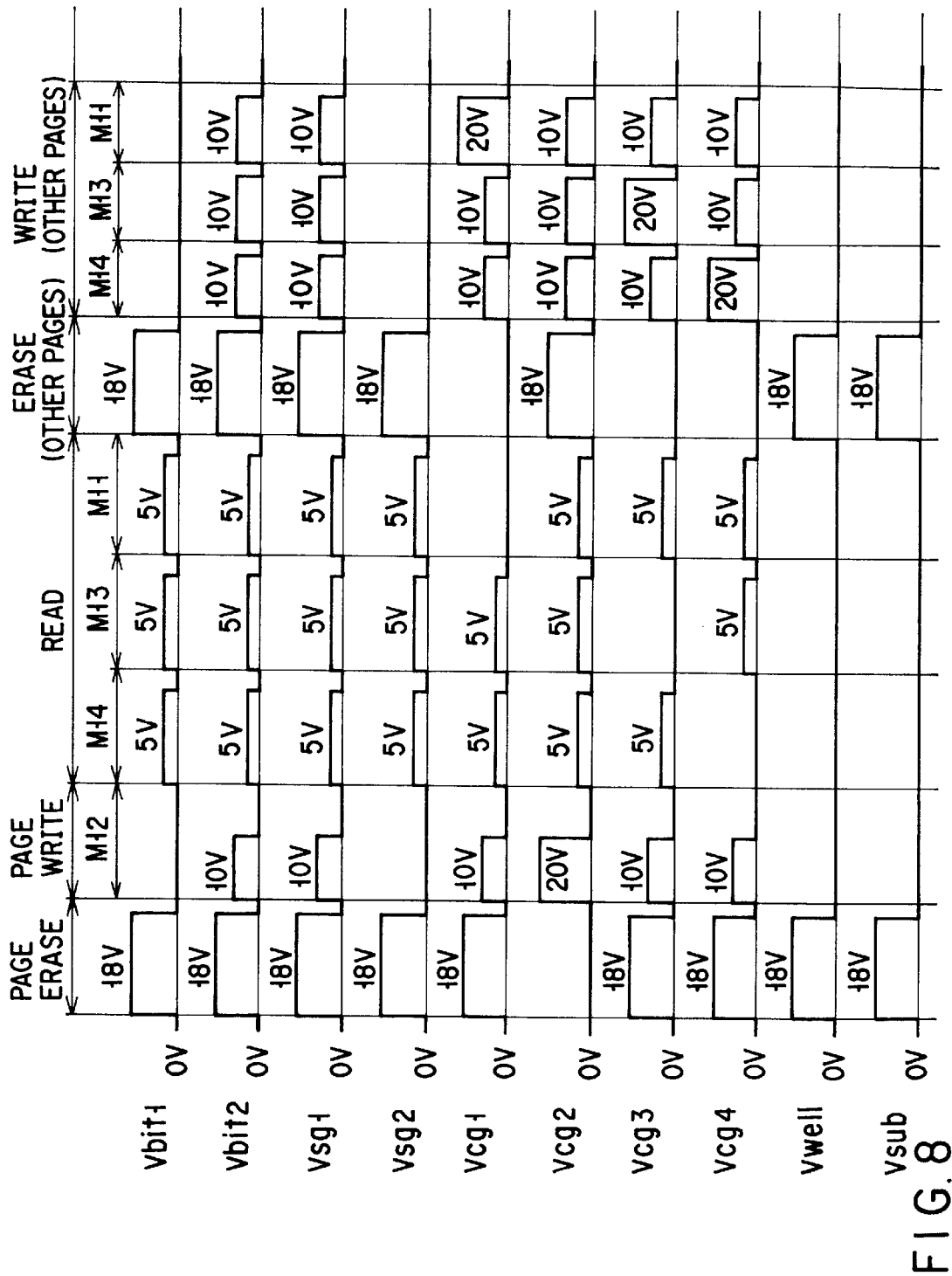
FIG. 8 is a timing chart for explaining the operation of the first embodiment according to the present invention.

FIG. 8 is a timing chart in the NAND-type EEPROM shown in FIG. 7. Each voltage in FIG. 8 assumes to have a definition like the one shown in FIG. 5. In the NAND-type EEPROM, a write operation and an erase operation are performed of exchanging electric charges using a tunnel current between a substrate and a floating gate.

An erase operation starts from selection of a block including a page to be erased. The page to be erased is selected. For example, the case wherein a page erase is performed for a page connected to a word line WL2 will be explained. In this case, Vcg2 is set to 0V, and a high potential of 18V is applied to Vcg1, Vcg3, Vcg4, Vsg1, Vsg2, Vwell, and Vsub. The potential of the bit line is also set to 18V. As a result, in only cells connected to the word line WL2, electric charges in the floating gates are discharged to the substrate to erase data of the memory cells of the page connected to the word line WL2. No discharge occurs in the memory cells of pages connected to word lines WL1, WL3, and WL4.

Then, new data are written in the selected cells (memory cells M12 to Mn2 of which data has been erased), i.e., a page write operation is performed. Vcg2 is set to 20V, Vcg1, Vcg3, and Vcg4 are to 10V, data is supplied to the bit line, and data are written in the memory cells of the page connected to the word line WL2. FIG. 8 shows the case wherein Vbit1 is write "0", and Vbit2 is write "1". At this time, data of Vcg1, Vcg3, and Vcg4 are kept unchanged. During a write operation, Vsg1 is set to 10V, and Vsg2, Vwell, and Vsub are to 0V.

Data of cells M11 to Mn1, cells M13 to Mn3, and cells M14 to Mn4 respectively connected to the word lines WL1, WL3, and WL4 are read. In the case shown in FIG. 8, data are read in the order distant from the bit line, i.e., the order from the word lines WL4, WL3, and WL1. The read data are stored in a buffer (not shown) in the chip or a memory outside the chip. During a read operation, the word line corresponding to a page to be read is set to 0V, the remaining word lines, the bit line, Vsg1, and Vsg2 are to, e.g., 5V, and Vwell and Vsub are to 0V.

Data of the cells of the three pages respectively connected to the word lines WL1, WL3, and WL4 are erased. More specifically, Vcg1, Vcg3, and Vcg4 are set to 0V, and a potential of 18V is applied to the wells and the substrate to discharge electric charges in the floating gates to the substrate. At this time, data of the page connected to the word line WL2 does not change because Vcg2 is set at 18V. During an erase operation, the potential of the bit line, Vsg1, and Vsg2 is 18V. This erase operation is simultaneously performed for three pages.

The data stored in the buffer in the chip or the memory outside the chip are read in the order distant from the bit line, i.e., the order from the word lines WL4, WL3, and WL1. The data are written in the cells where the data are written before the erase. That is, Vcg4 is set to 20V, and Vcg1, Vcg2, and Vcg3 are to 10V. The data having been stored in the memory cells connected to the word line WL4 before the erase operation are read from the buffer in the chip or the memory outside the chip. The read data are written in the memory cells M14 to Mn4 connected to the word line WL4. At this time, the same data is written in a location where the data is written before the erase operation. During a write operation, Vsg1 is set to 10V, and Vsg2, Vwell, and Vsub are to 0V. The same write operation is sequentially performed for the memory cells M13 to Mn3 and M11 to Mn1 respectively connected to the word lines WL3 and WL1.

By this operation, only data of the memory cells connected to the word line WL2 are rewritten to new data, whereas the same data before performing a series of operations described above are rewritten in the memory cells connected to the remaining word lines WL1, WL3, and WL4. That is, data of only the selected page are rewritten (page erase is performed).

The above operation of the first embodiment will be compared with the conventional operation.

In the prior art, when a page having repeatedly undergone a page erase/page write operation exists, other pages in the same block become in the erroneous write mode the repeat number of times. As the repeat number increases, an actual write error occurs, resulting in a failure.

According to the first embodiment, however, in other pages within the block including the selected page, data are temporarily externally read every page erase operation, and stored in a given memory in the chip or outside the chip. The data of other pages are erased, and then the data stored in the given memory are written (written back) in the original cells. Therefore, only the influence of the erroneous write mode corresponding to the number of pages of one block at most is accumulated, like the conventional block erase, so no actual write error occurs.

(Second Embodiment)

Figure 9:
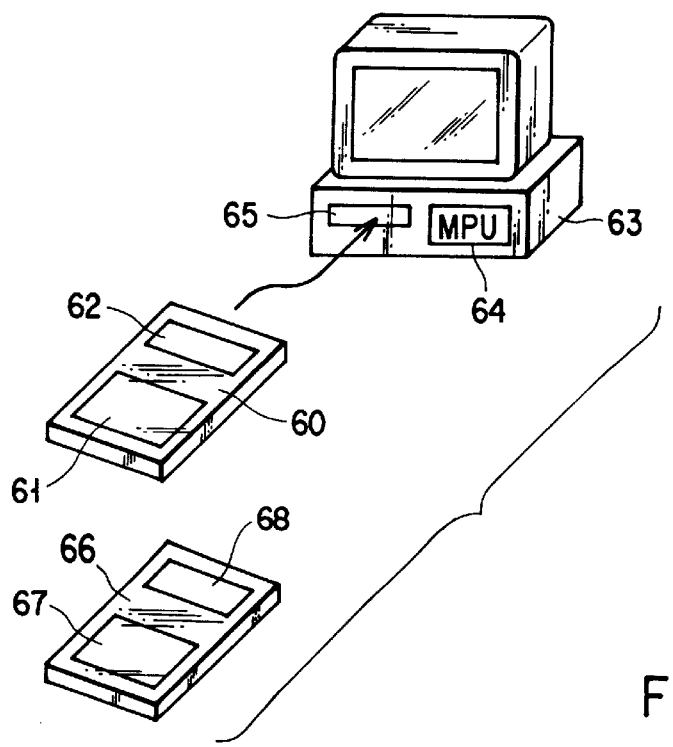
FIG. 9 is a view showing a memory card system as a second embodiment of the nonvolatile semiconductor memory device according to the present invention.

FIG. 9 shows a memory system using a memory card with the NAND-type EEPROM of the present invention shown in FIG. 7 according to the second embodiment of the present invention.

In FIG. 9, a memory chip 61 serving as a NAND-type EEPROM (having the same arrangement as that in the first embodiment), and a controller chip 62 are arranged on a memory card 60. It is also possible that a memory card comprises only a NAND-type EEPROM and is downsized, a controller chip is separately prepared, and the memory card and the controller chip are mounted on an adapter. On an adapter 66 shown in FIG. 9, a stamp-sized memory card 67 having a NAND-type EEPROM is mounted, and a controller chip 68 is arranged. The memory card 67 is detachable from the adapter 66.

A computer 63 incorporates an MPU 64, and comprises a slot 65 for allowing loading of the memory card 60 or the adapter 66.

The controller 6 for the NAND-type EEPROM shown in FIG. 7 is normally arranged in the controller chip 62 or 68, but may be arranged in the memory chip 61 or the memory card 67. The MPU 64 of the computer 63 may perform the same control as that of the controller 6 shown in FIG. 7.

Figure 10:
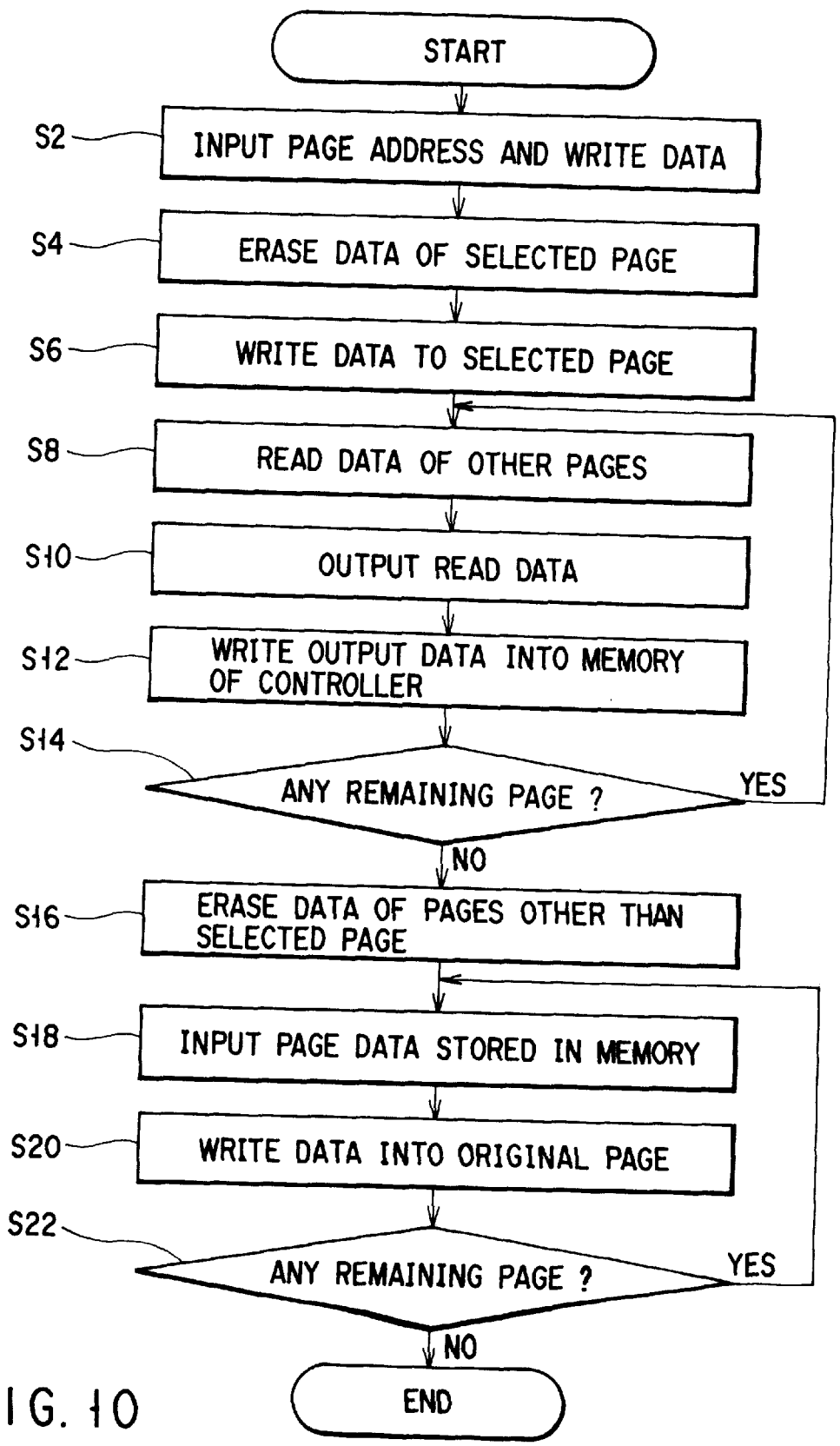
FIG. 10 is a flow chart for explaining the operation of the second embodiment.

FIG. 10 is a timing chart for explaining a page erase/write operation in the second embodiment.

In step S2, a page address and data subjected to a page erase/page write operation are input outside the chip, e.g., from the computer 63, and supplied to the memory card 60 or the adapter 66 loaded in the slot 65. In step S4, data of a selected page is erased.

In step S6, the input data is written in the selected page.

In step S8, data of other pages in the same block including the selected page are read. In step S10, the read data are externally output from the memory chip 61 or the memory card 67. In step S12, the data are stored in a memory within the controller chip 62 or 68. Alternatively, the read data may be stored in a memory associated with the MPU 64 in the computer 63.

In step S14, it is checked whether any remaining page from which data is not read exists in this block. If YES in step S14, the flow returns to step S8 to similarly read data of the remaining page in the same block and store the data in the memory within the controller chip 62 or 68 or the memory associated with the MPU 64. That is, according to the second embodiment, after an erase/write operation is performed for a selected page, data of all other pages in the block including the selected page are read and stored in a predetermined memory.

In step S16, the data of the pages other than the selected page of which data are erased in steps S4 and S6 are simultaneously erased. In step S18, the data stored in the memory within the control chip or the memory associated with the MPU are read. In step S20, the read data are written (written back) in the original memory cells of the original pages. In step S22, it is checked whether data are written back in all the pages. If there is any remaining page to be written back, the flow returns to step S18 to similarly write back the data of a remaining page.

Also with the above operation, after data of a selected page is erased, and new data is rewritten, data of other pages in the same block are externally read and stored, the data of other pages are erased, and then the data of other pages are rewritten, similarly to the first embodiment. Accordingly, no influence of the erroneous write mode in a page erase operation is accumulated many times not to cause any actual write error.

(Third Embodiment)

Figure 11:
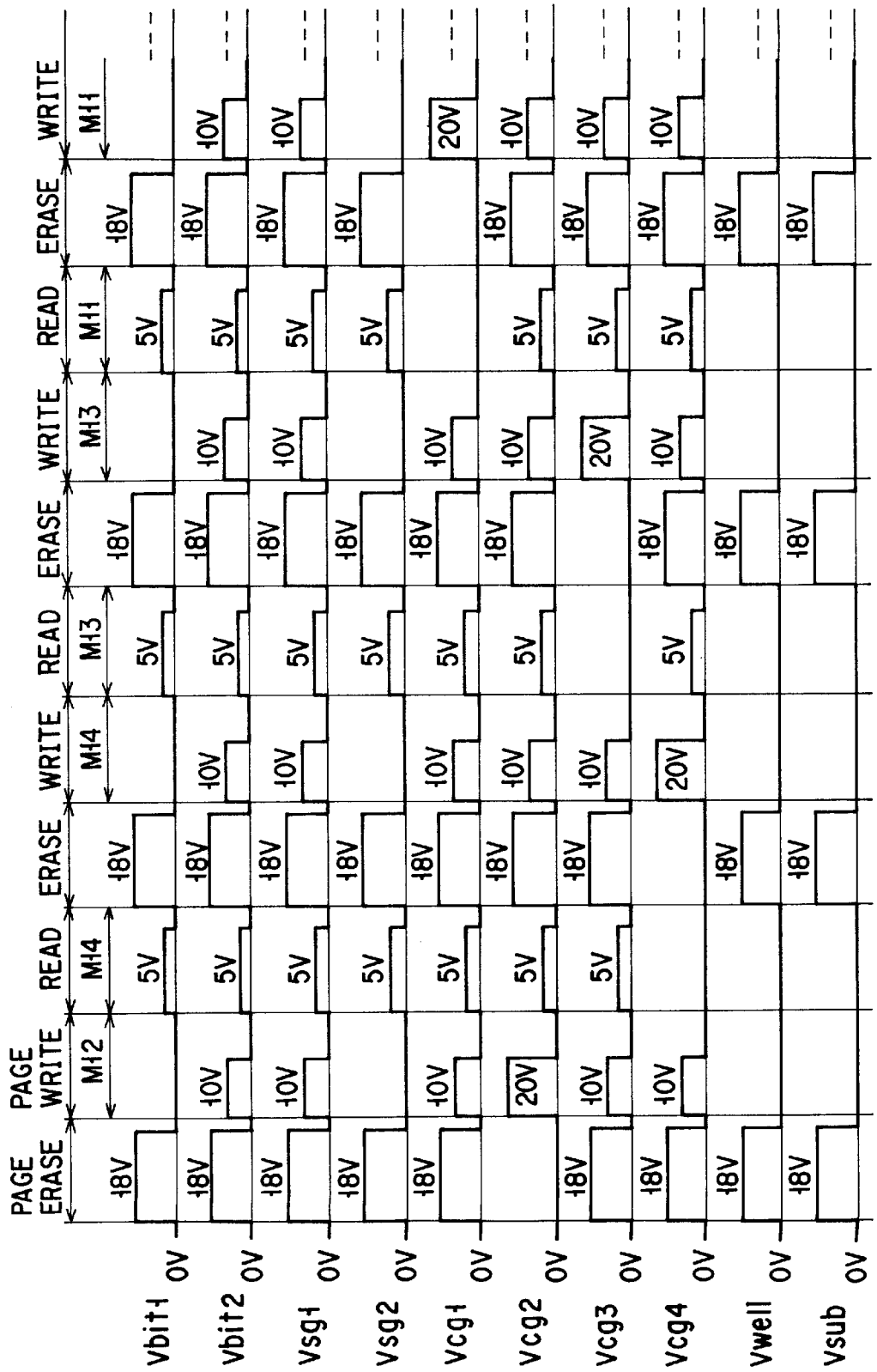
FIG. 11 is a timing chart for explaining the operation of a third embodiment of the nonvolatile semiconductor memory device according to the present invention.

The third embodiment in which the arrangement is the same as that in the first embodiment but the operation is different will be described below. FIG. 11 is a timing chart showing the operation of the third embodiment according to the present invention. A NAND-type EEPROM of the third embodiment has the same arrangement as that in the first embodiment shown in FIG. 7. The third embodiment also exemplifies the case of performing a page erase/page write operation for a page connected to a word line WL2.

A page erase operation and a page write operation for the page connected to the word line WL2 are performed similarly to the first embodiment.

After a page write operation, data of cells (data of a page) connected to a word line WL4 are read and stored in a buffer arranged in a chip, a memory arranged outside the chip, or dedicated memory cells in a cell array. Then, the data of the memory cells connected to the word line WL4 are erased. The data of the memory cells connected to the word line WL4 that are stored in the buffer, the memory, or the dedicated memory cells are written in the original memory cells. The same operation is repeatedly performed for memory cells connected to word lines WL3 and WL1.

In this way, the same data are rewritten in the memory cells connected to the word lines WL4, WL3, and WL1.

Using this method, occurrence of a write error can be prevented like the first and second embodiments. In addition, since data stored in the buffer, the memory outside the chip, or the dedicated memory cells corresponds to only one page, and the data amount is smaller than that in the first or second embodiment, the capacity of the buffer in the chip, the memory outside the chip, or the dedicated memory cells can be decreased to reduce the cost.

(Fourth Embodiment)

Figure 12:
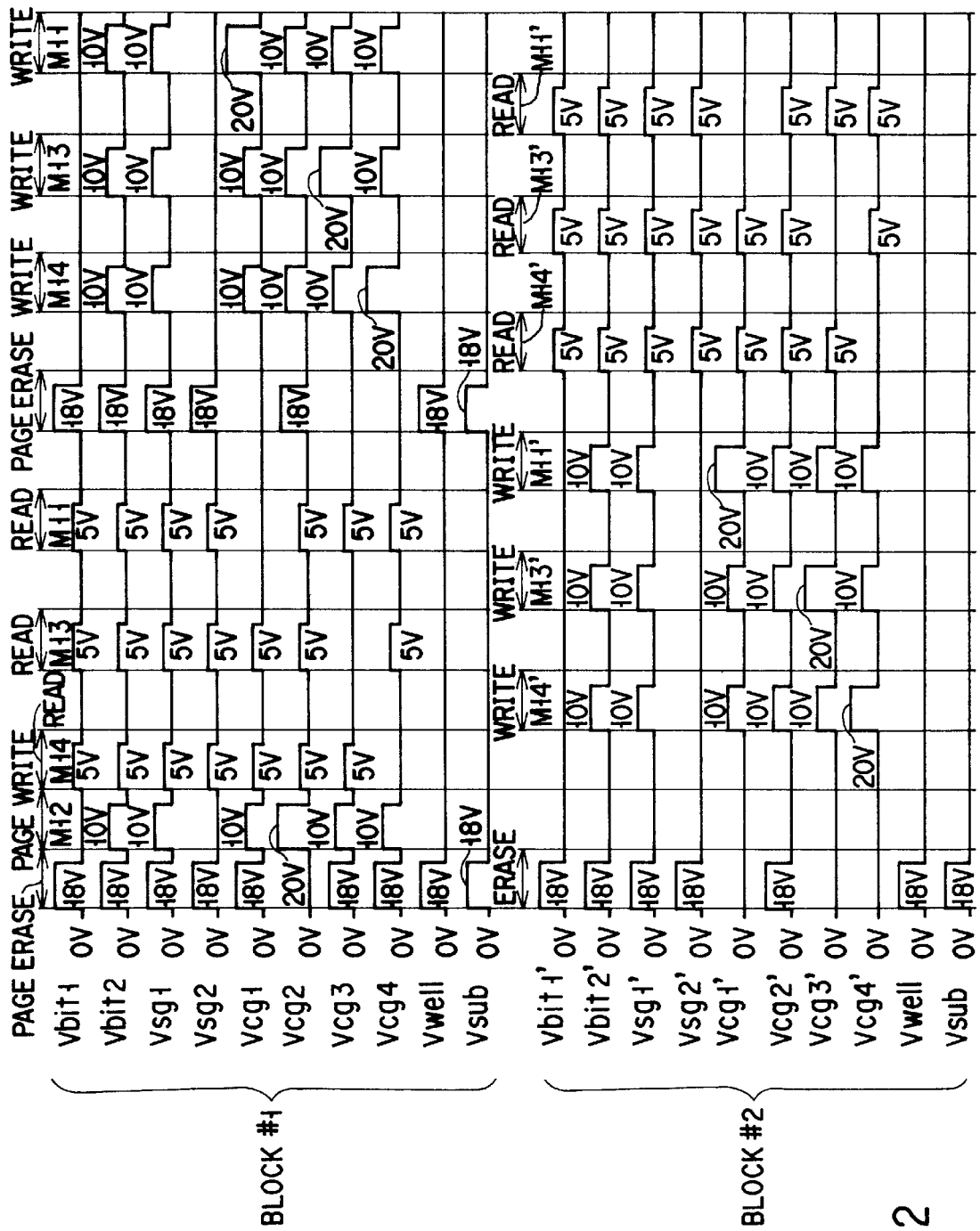
FIG. 12 is a timing chart for explaining the operation of a fourth embodiment of the nonvolatile semiconductor memory device according to the present invention.

FIG. 12 is a timing chart showing the operation of the fourth embodiment according to the present invention. A NAND-type EEPROM of the fourth embodiment has the same arrangement as that in the first embodiment shown in FIG. 7. The fourth embodiment also exemplifies the case of performing a page erase/page write operation for a page connected to a word line WL2.

Note that the word line WL2 assumes to belong to a first block #1.

A page erase operation and a page write operation for the page connected to the word line WL2 of the first block #1 are performed. These operations are the same as those in the first embodiment. At the same time as the page erase of the block #1, data of the memory cells of other unused blocks (not storing meaningful data) in the memory cell array are also erased. The controller 6 grapes whether each block is in use. For example, after another block #2 is selected, Vcg1', Vcg3', and Vcg4' are set to 0V for word lines WL1', WL3', and WL4' other than a word line WL2' corresponding to the word line WL2 selected in the block #1, thereby erasing data of memory cells connected to these word lines. In FIG. 12, although data of the page connected to the word line WL2 of the block #1 and data of the pages connected to the word lines WL1', WL3', and WL4' of the block #2 are simultaneously erased, the data of these pages need not always be simultaneously erased. For the word line WL2' corresponding to the word line WL2 that is selected in the block #2, Vcg2' may be set to 0V to erase data of the whole block #2.

Then, data of the memory cells M14 to Mn4 connected to a word line WL4 are read. These data are written and stored in corresponding cells M14' to Mn4' in the block #2 within the chip. Similarly, data of the memory cells M13 to Mn3 and M11 to Mn1 respectively connected to word lines WL3 and WL1 are read. These data are written and stored in corresponding memory cells M13' to Mn3' and M11' to Mn1' in the block #2.

Thereafter, the data of the memory cells connected to the word lines WL4, WL3, and WL1 in the block #1 are erased.

The data of the memory cells connected to the word line WL4 of the block #1 that are stored in the memory cells connected to the word line WL4' of the block #2 are written in the original memory cells M14 to Mn4. The same operation is repeatedly performed for the data of the memory cells connected to the word lines WL3 and WL1 of the block #1 that are respectively stored in the memory cells connected to the word lines WL3' and WL1' of the block #2.

In this manner, the same data are written in the memory cells M14 to Mn4, M13 to Mn3, and M11 to Mn1 respectively connected to the word lines WL4, WL3, and WL1 of the block #1.

Using this method, occurrence of a write error can be prevented like the first, second, and third embodiments. In addition, since data of pages other than a selected page in the same block are temporarily stored in an unused block within the memory cell array, a buffer or memory outside the chip need not be used.

Accordingly, the buffer in the chip or the memory outside the chip can be eliminated to further reduce the cost, compared to the first to third embodiments.

The fourth embodiment can be modified as follows.

(1) Data of the memory cells connected to the word lines WL4, WL3, and WL1 other than a selected word line may be stored in not the same block but different blocks.

(2) A memory cell area (block) dedicated for temporarily storing data of the word lines other than the selected word line may be formed in the memory cell array.

(3) Since the bit line potential Vbit changes to a voltage in the state "0" or "1" depending on data in a memory cell upon a read operation, this voltage relationship can be directly used as Vbit in a write operation for another block. In this case, although the states "0" and "1" reverse upon transferring data from block #1 to block #2, they reverse again in returning the data from block #2 to block #1, so no problem arises. This voltage relationship is shown in Table 1.

TABLE 1

| Bit Line Potential "Data" | | Operation |
| --- | --- | --- |
| VCC | 0 | Read |
| "0" | "1" | |
| 0 | VM' | Write to another block |
| "0" | "1" | |
| VCC | 0 | Read |
| "0" | "1" | |
| 0 | VM | Restore to original cells |
| "0" | "1" | |

With this setting, in writing data read from a non-selected word line in another block, the data need not be temporarily stored in a buffer outside the cell, unlike a normal operation. In writing data read from the other block in the original block, the data need not be temporarily stored in the buffer outside the cell, unlike a normal operation, resulting in a high-speed operation.

(Fifth Embodiment)

In the above-mentioned embodiments, an erase/write operation is performed in units of pages, but the present invention is not limited to this. For example, an erase may be performed in units of blocks. The fifth embodiment in which the arrangement is the same as that in the first embodiment but a block erase operation is performed instead of the page erase operation will be described below.

Data of memory cells in a selected block to which no new data is written are read and stored in a buffer inside or outside the chip. Then, the data of the memory cells in the selected block are erased in units of blocks. The data stored in the buffer inside or outside the chip are rewritten in the original memory cells. Before or after the rewrite of data, new data are written in memory cells in which the new data are wanted to be written. Since data are rewritten every erase, no write error occurs.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the first, third, and fourth embodiments can also be applied to the memory system using the memory card, like the second embodiment. Although the above embodiments have exemplified the NAND-type EEPROM, the present invention is not limited to this and can be applied to various EEPROMs having selection gates. In addition to the EEPROM having a floating gate, the present invention can also be applied to a NAND-type EEPROM using an NMOS memory cell. The present invention can be applied to a ground array cell having a bit line of a diffusion layer, a FACE cell, and an AND cell. The present invention can be further applied to a DINOR cell having a sub-bit line. The present invention can be variously modified without departing from the spirit and scope of the invention.

As has been described above, according to the present invention, when a page erase operation and a page write operation are performed, data of all pages other than a selected page in the same block are temporarily read and stored in another location. After erasing the data of these pages, the stored data are rewritten in the original memory cells. Therefore, no influence of the erroneous write mode is accumulated not to cause a write error. Therefor, a nonvolatile semiconductor memory device, memory card, and memory system having high reliability can be realized.

I claim:

1. A nonvolatile semiconductor memory device comprising:
 a memory cell array having memory cell units each formed of memory cells and serving as a data write unit, and blocks each formed of the memory cell units, wherein any one of the blocks is selected, any one of memory cell units in a selected block is selected, data stored in a selected memory cell unit is erased, new data is written in the selected memory cell unit, data stored in non-selected memory cell units within the selected block is read and stored, data of the non-selected memory cell units are erased, and the stored data are rewritten in the non-selected memory cell units.

2. A device according to claim 1, in which a series of data read, erase, and rewrite operations for the non-selected memory cell units are performed a plurality of times in units of memory cell units.

3. A device according to claim 1, in which a predetermined number of memory cells form a page which is the data write unit.

4. A device according to claim 1, in which data of the memory cells of the selected memory cell unit are substantially simultaneously erased.

5. A device according to claim 4, in which data of at least one page are substantially simultaneously erased.

6. A device according to claim 3, in which a series of data read, erase, and rewrite operations for the non-selected memory cell units are performed a plurality of times in units of pages.

7. A device according to claim 1, in which data of the memory cells of the non-selected memory cell units of the selected block are substantially simultaneously erased.

8. A device according to claim 1, in which data stored in the non-selected memory cell units within the selected block are read and stored in one of an external memory unit and a buffer memory cell arranged in said memory cell array.

9. A device according to claim 1, in which data stored in the non-selected memory cell units within the selected block are read and stored in another block within said memory cell array.

10. A device according to claim 1, in which said memory cell array is formed of arraying, in a matrix, cell units which is formed of plural memory cells.

11. A device according to claim 1, in which each block is formed of cell units commonly using a plurality of word lines.

12. A device according to claim 1, in which each memory cell unit is formed of plural memory cells connected to one word line.

13. A memory card comprising:
 a nonvolatile semiconductor memory device having memory cell units each formed of memory cells and serving as a data write unit, and blocks each formed of memory cell units; and
 a controller for selecting any one of the blocks, selecting any one of memory cell units in a selected block, erasing data stored in a selected memory cell unit, writing new data in the selected memory cell unit, reading data stored in non-selected memory cell units within the selected block, storing the read data erasing data of the non-selected memory cell units, and rewriting the stored data in the non-selected memory cell units.

14. A memory system comprising:
 a memory card having a nonvolatile semiconductor memory device with memory cell units each formed of memory cells and serving as a data write unit, and blocks each formed of memory cell units; and
 a controller for selecting any one of the blocks, selecting any one of the memory cell units in a selected block, erasing data stored in the selected memory cell unit, writing new data in the selected memory cell unit, reading data stored in non-selected memory cell units within the selected block, storing the read data, erasing data of the non-selected memory cell units, and rewriting the stored data in said buffer memory in the non-selected memory cell units.

15. A system according to claim 14, further comprising:
 an adapter to which said memory card is detachably mounted.

16. A system according to claim 15, in which said controller is arranged in said adapter.

17. A method of controlling a nonvolatile semiconductor memory device, comprising:
 a first step of selecting a block in a memory cell array including memory cell units each formed of memory cells and serving as a data write unit, and blocks each formed of memory cell units, and any one of the memory cell units in a selected block;
 a second step of erasing data stored in memory cells of a selected memory cell unit, and writing new data in the memory cells of the selected memory cell unit; and
 a third step of reading data stored in non-selected memory cell units within the selected block, storing the read data, erasing data of the non-selected memory cell units, and rewriting the stored data in the non-selected memory cell units.

18. A method according to claim 17, in which the third step comprises a step of performing a series of data read, erase, and rewrite operations for the non-selected memory cell units in units of memory cell units a plurality of times.

19. A method according to claim 17, in which the third step comprises a step of storing the read data in one of an external memory unit and a buffer memory cell arranged in said memory cell array.

20. A method according to claim 17, in which the third step comprises a step of storing the read data in another block within said memory cell array.

21. A method according to claim 17, in which said second step and said third step comprises following steps of:
 erasing data stored in memory cells of the selected memory cell unit;

writing new data in the memory cells of the selected memory cell unit;

reading data stored in memory cells of non-selected memory cell units within the selected block;

storing the read data;

erasing data of the memory cells of the non-selected memory cell units; and rewriting the stored data in the non-selected memory cell units.

22. A method according to claim 17, in which said second step and said third step comprises following steps of:

reading data stored in memory cells of non-selected memory cell units within the selected block;

storing read data;

erasing data of the memory cells of the selected block;

writing new data in the memory cells of the selected memory cell unit; and rewriting stored data in the memory cells in the non-selected memory cell units.

23. A method according to claim 17, in which a predetermined number of memory cells form a page which is the data write unit and a series of data read, erase, and rewrite operations for the non-selected memory cell units are performed a plurality of times in units of pages.

* * * * *